(12) United States Patent
Larsson et al.

(10) Patent No.: US 7,997,403 B2
(45) Date of Patent: Aug. 16, 2011

(54) MECHANICAL INTERFACE

(75) Inventors: Andreas Larsson, Goeteborg (SE);
Martin Dahlberg, Landvetter (SE);
Robert Axelsson, AElvsjoe (SE);
Kristofer Karlsson, Kungsbacka (SE)

(73) Assignee: Mydata Automation AB, Bromma (SE)

( * ) Notice: Subject to any disclaimer, the term of this patent is extended or adjusted under 35 U.S.C. 154(b) by 0 days.

(21) Appl. No.: 12/594,113

(22) PCT Filed: Mar. 27, 2008

(86) PCT No.: PCT/SE2008/050350
§ 371 (c)(1),
(2), (4) Date: Nov. 19, 2009

(87) PCT Pub. No.: WO2008/121059
PCT Pub. Date: Oct. 9, 2008

(65) Prior Publication Data
US 2010/0116625 A1    May 13, 2010

(30) Foreign Application Priority Data

Mar. 30, 2007 (EP) .................... 07105379

(51) Int. Cl.
*B65G 27/04* (2006.01)
(52) U.S. Cl. ...................... 198/771; 198/763
(58) Field of Classification Search .............. 198/763, 198/771
See application file for complete search history.

(56) References Cited

U.S. PATENT DOCUMENTS

| | | | | |
|---|---|---|---|---|
| 3,025,944 A * | 3/1962 | Sloan et al. | ................. | 198/383 |
| 3,134,483 A * | 5/1964 | Musschoot et al. | ........... | 198/766 |
| 4,687,093 A * | 8/1987 | Marshall et al. | ........... | 198/465.2 |
| 4,974,390 A | 12/1990 | Gill et al. | | |
| 4,995,157 A | 2/1991 | Hall | | |
| 5,085,314 A * | 2/1992 | Higson | ........................ | 198/755 |
| 5,184,716 A | 2/1993 | Gaines | | |
| 5,238,360 A * | 8/1993 | Foster | ........................ | 414/525.9 |
| 5,277,300 A | 1/1994 | Maggioni | | |
| 5,445,261 A | 8/1995 | Kimura | | |
| 5,651,176 A | 7/1997 | Ma et al. | | |
| 5,664,664 A * | 9/1997 | Gaines | ........................ | 198/769 |
| 5,704,466 A * | 1/1998 | Mosher | ........................ | 198/771 |
| 6,105,753 A * | 8/2000 | Graham | ........................ | 198/763 |
| 6,814,211 B2 * | 11/2004 | Yunker et al. | ............. | 193/25 FT |
| 7,439,454 B2 * | 10/2008 | Komatsu et al. | ........... | 177/25.18 |
| 7,754,984 B2 * | 7/2010 | Sugioka et al. | ............... | 177/119 |

* cited by examiner

Primary Examiner — Douglas A Hess
(74) Attorney, Agent, or Firm — Birch, Stewart, Kolasch & Birch, LLP

(57) ABSTRACT

A mechanical interface for transferring a reciprocating movement from one element to another element releasably mountable thereto. The interface comprises at least three interface points, at least two of which being laterally spaced apart, and at least two of which being longitudinally spaced apart. A motion generator provides a reciprocating movement, which is transferred from the one element to the other element via at least one of the interface points. The interface point(s) transferring the movement includes contact portions having curved contact surfaces, such that the curved contact surfaces are in abutment with opposing contact surfaces of the interface point when the elements are mounted, thereby transferring the reciprocating movement.

22 Claims, 5 Drawing Sheets

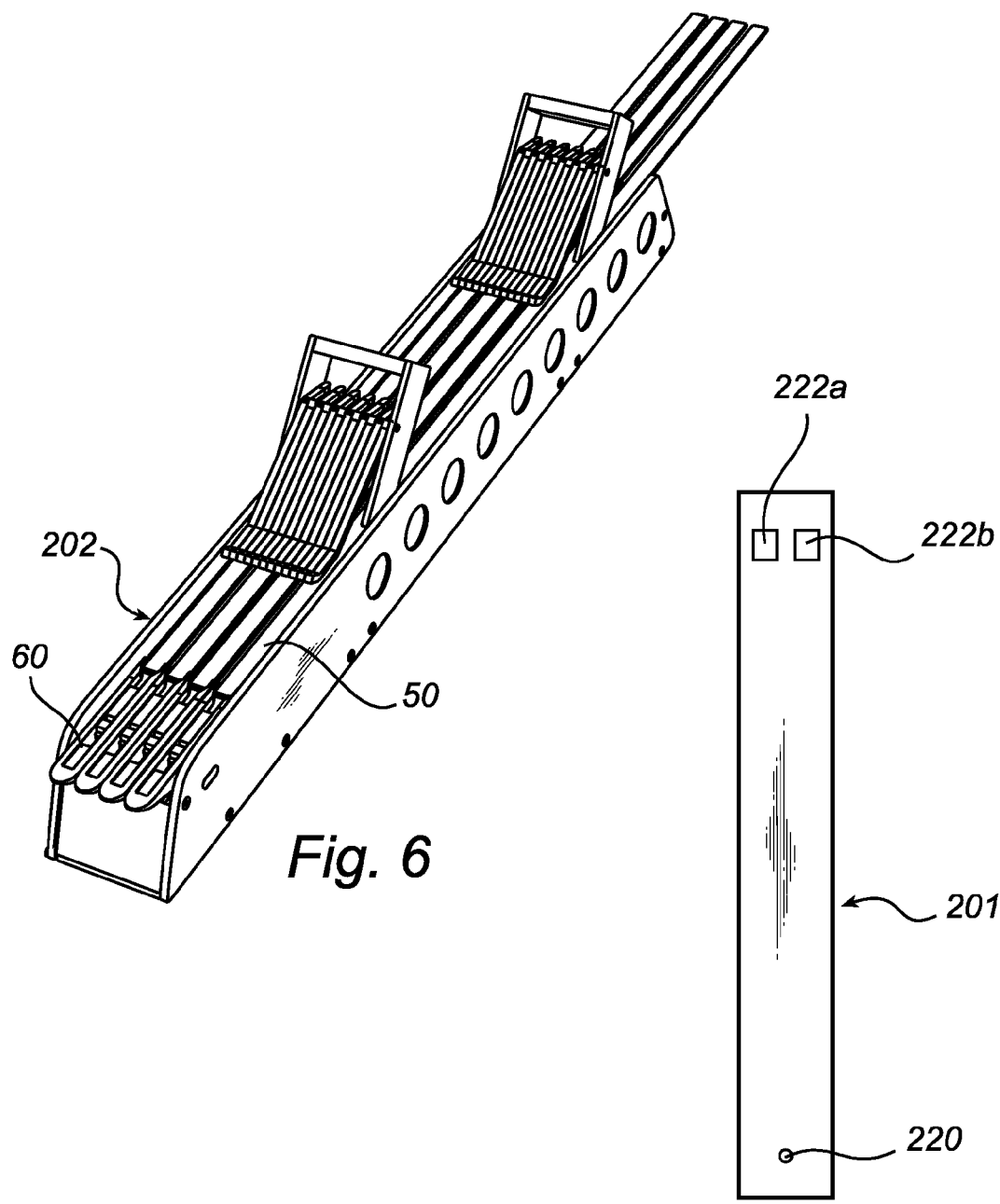

MECHANICAL INTERFACE

TECHNICAL FIELD OF THE INVENTION

The present invention generally relates to the field of interfacing elements and transferring movements. More specifically, the invention relates to a mechanical interface for transferring a reciprocating movement from a base element to an interacting element, wherein the interacting element is releasably mountable to the base element.

BACKGROUND OF THE INVENTION

When transferring a reciprocating motion from one element to another element, it is often required or at least desired that the movement is transferred without undue vibrations. This is particularly true when the reciprocating movement is used as a feeding movement for feeding components, for instance small electronic components for mounting on a substrate such as a surface mounted circuit board. Vibrations tend to increase with speed and acceleration of the movement, which can be met by reducing speed and/or acceleration. However, such a solution would be a problem in many technical fields, especially due to the ever-increasing demand of reducing manufacturing times. A further way to reduce vibrations is to provide a solid and firm engagement between the two elements between which the movement is to be transferred, for instance by screwing, welding, press fitting, or securing elements to each other by other means, and thereby providing a secure and tight engagement between the elements. However, such a solution is seldom appreciated in situations where the elements are to be separated from each other on a regular basis, and where the time required for replacing engaging and interacting elements affects the overall manufacturing time, or the like, and corresponding costs.

SUMMARY OF THE INVENTION

It is an object of the present invention to provide a mechanical interface for transferring a reciprocal movement between two elements releasably mountable to each other, that reduces vibrations while maintaining a fast and easy mounting.

This and other objects are achieved according to the present invention by providing a component tube holding arrangement and a system having the features defined in the independent claims. Preferred embodiments are defined in the dependent claims.

For the purpose of clarity, the term longitudinal refers to the main direction of the reciprocating movement, whereas the term lateral refers to the direction perpendicular to the longitudinal direction. In other words, the longitudinal extension of an element is the extension along or parallel to the direction of reciprocating movement, and the lateral extension is the extension essentially perpendicular to the longitudinal extension. In other words, even though elements will be described having a greater longitudinal than lateral extension, the opposite dimensional relationships are also within the scope of the present application.

It should also be noted that, in the context of this application, the terms reciprocal or reciprocating includes not only a linear, back-and-forth motion, but also a movement along an elliptical or near circular path. Such an elliptical or near circular feeding motion path generally occurs in a vertical plane.

According to an aspect of the invention, there is provided a mechanical interface for transferring a reciprocating movement from a base element to an interacting element, wherein the interacting element is releasably mountable to the base element. The interface comprises at least a first, second and third interface point between the base element and the interacting element, wherein each interface point comprises a base contact portion and an interacting contact portion. The base element comprises or is connectable to motion means for providing said reciprocating movement essentially in a first, longitudinal direction. Furthermore, at least two of said first, second and third interface points are longitudinally spaced apart, and at least two of said first, second and third interface points are laterally spaced apart in a second, lateral direction essentially perpendicular to said first direction. Also, at least one of said first, second and third interface points is arranged to transfer said reciprocating movement from the base element to the interacting element, wherein the interface point(s) arranged to transfer said reciprocating movement include(s) a base contact portion and an interacting contact portion. At least one of said contact portions presents at least two oppositely facing curved contact surface portions, arranged in longitudinal alignment with said first direction, such that said curved contact surface portions are in abutment with opposing contact surface portions of the interface point when the interacting element is mounted to the base element. Thereby, said reciprocating movement is transferred from the base element to the interacting element.

Thus, the present invention is based on the insight of providing at least three interface points, between a base element and an interacting element, laterally and longitudinally spaced apart, and wherein at least one of the three interface points presents a curved contact surface portion on at least the base element or the interacting element. In other words, at least two of the three interface points are laterally spaced and at least two of the three interface points are longitudinally spaced. Thereby, a very stable interface having three interface points spaced in an essentially triangular configuration is provided.

Furthermore, the curved contact surface portions ensure that there will be no gaps in the engagement provided by the three interface points, even though the exact orientation of the interacting element would vary. To clarify, if the orientation due to mechanical tolerances of the interacting element results in a misalignment of the three interface points, i.e. that the points of engagement do not lie in a plane as intended or desired, and a resulting rotation of the interacting element transversal to the direction of movement is obtained, the curvatures of the interface surface portions would result in the abutment or point of contact between opposing surface portions simply being moved to another position along the curvatures. Such "misalignments" could be the result of both base and interacting elements being exchangeable and the differences in manufacturing tolerances being such, by choice or accident, that different elements fit differently to each other. Also, wear of the interface portions and contact points may also result in different fits between different elements. Thus, the curvature of the interface surface portions results in an essentially stable and gap free engagement, i.e. an essentially perfect fit, regardless of any misalignments or tolerances of the interface portions or points normal to the plane formed by the interface points.

Thus, the abutments, or at least portions thereof, between the curved contact surface portions and the opposing contact surface portions are in alignment with the longitudinal direction of the base and interacting elements. In other words, the forces applied during the forward and rearward motion of the reciprocal movement cycle acts on the points of abutment of the curved contact surface portions. Thereby, the wear at the point of contact may be reduced as compared to a configuration where an abutment is provided between essentially straight contact surfaces arranged at an angle in relation to each other.

Furthermore, it is often desired that the location for the point of engagement, i.e. the abutments between the engaging contact surfaces at a motion transferring interface point, is well-defined in a direction normal to the longitudinal or movement direction, for instance vertically if the direction of movement is horizontal. If essentially straight contact surfaces are used, the abutment therebetween becomes sensitive to any rotational misalignment between the base and interacting element. In other words, if a rotation would occur tilting the rear end, as seen in the movement direction, of the interacting element up or down, the abutment between engaging contact surfaces would move to the end points of the respective contact surfaces. Consequently, control of the location for the point of engagement would be compromised, as compared to the inventive solution of using at least one curved contact surface.

As will be described in further detail below, the interface point having curved contact surface portions includes two oppositely arranged curved contact surfaces. Thus, the curved contact portions are provided at the forward and rearward portion of the base or interacting contact portion of an interface point, i.e. in alignment with the feeding or longitudinal direction of the reciprocating movement.

Furthermore, the curved surface portions are preferably outward bulging or convex surface portions of a protrusion. However, in embodiments where the curved contact portions form part of a recess, then inward bulging or concave surface portions, i.e. bulging towards the centre of the recess, are also contemplated within the scope of the present invention. It should be noted that such inward bulging contact surface portions of a recess and outward bulging contact surface portions of a protrusion could even, in particular embodiments, be mating or engaging contact surface portions of a single interface point.

According to the invention, one or more interface points can be arranged for transferring the reciprocating movement from the base element to the interacting element. Thus, embodiments where all mechanical interface points are arranged for transferring the reciprocating movement, or are at least moved simultaneously and in accordance with the reciprocating movement, are contemplated within the scope of the present invention. However, it has been found preferable for some configurations to provide one or more "passive" interface points, which will be described more clearly in the following.

Preferably, a plurality of laterally spaced motion transferring interface points are provided in embodiments where the interacting element has a lateral extension that is not insignificant, or where the centre of gravity may differ in the lateral direction, for instance as a result of different configurations between different interacting elements, or variations in the load of a particular type of interacting element from time to time. Such variations could even arise during the actual motion process, for instance in embodiments where the elements are used for feeding components to a picking site, where components are picked and removed from the interacting element, possibly resulting in an offset load thereof. Then, preferably two laterally spaced motion transferring interface points are provided, suitably provided on either side of the lateral centre of gravity for the interacting element, for maintaining a balanced engagement action between the elements throughout the motion process.

However, for embodiments where the interacting element has a small lateral extension, in particular as compared to the longitudinal extension thereof, i.e. resulting in a reasonably slender configuration, a single interface point may be provided for transferring the reciprocating movement. Such a single motion transferring interface point is preferably provided in alignment with the lateral centre of gravity of the interacting element, such that any rotational forces arising from the reciprocating movement is reduced to a minimum.

In particular embodiments of the invention, a plurality of interface points for transferring the reciprocating movement are provided, longitudinally spaced apart in alignment with the lateral centre of gravity of the interacting element. Again, such a configuration is preferably provided where the interacting element has a slender configuration, or an essentially balanced configuration in relation to the longitudinal axis thereof, and possibly a significant mass that is unsuitable for engagement via a single interface point.

In the examples where a plurality of motion transferring interface points are provided, the portions thereof located in the base element are preferably arranged on a single motion transferring element, which in turn is operatively connected to a motion generating means. However, other alternatives are also contemplated, such as having a plurality of motion transferring elements operatively connected to motion generating means.

It should be noted that use may be made of motion generating means that are generally known and readily available within the art, such as solenoids, linear motors, belts or wires driven by rotating motors, rotation of a cam or a lead screw, etc. Therefore, the motion generating means will not be described in further detail.

At the point of abutment between a curved contact surface of a motion transferring interface point and an opposing contact surface, curved or planar, the abutment forms a tangent plane at an angle to a lateral plane aligned with the direction of the reciprocating movement, here referred to as a lateral plane of motion. In embodiments of the invention, the angle between the tangent plane and said lateral plane of motion is between 88° and 70°, preferably between 85° and 75°, and even more preferably between 82° and 78°. Then, the reciprocating feeding movement may be transferred almost normal to the plane of the abutment, which will minimize disturbing forces generated by the movement and significantly reduce or eliminate vibrations. Furthermore, the preferred angles are sufficiently small to avoid a wedging effect between the interface points of the base and interacting elements. Thus, by increasing the angle, the wedging effect is increased, hampering easy mounting and release of the interacting element to and from the base element, and by decreasing the angle, the risk of vibrations and offset motion forces disturbing the feeding action is increased.

In the exemplifying embodiment described below in relation to the drawings, said angle is 80°. In that embodiment, the opposing contact surfaces of the motion transferring interface point of the interacting element has the cross-sectional shape of a frustum cone. Then, said angle can also be expressed as a cone angle, which in this embodiment is about 20° and corresponds to said angle between the tangent plane and said lateral plane of motion of about 80°. If the above stated preferred angles are expressed as cone angles of an essentially symmetrical motion transferring interface point, the cone angle would in embodiments of the invention be between 5° and 40°, preferably between 10° and 30°, and more preferably between 15° and 25°.

In further embodiments of the invention, the point(s) of abutment between the mating contact surfaces of the motion transferring interface point(s) are preferably provided in essential alignment, e.g. in the same plane, with the direction of the reciprocating movement and the centre of gravity of the interacting element. Thereby, there will essentially arise no forces acting to rotate or move the interacting element in other directions than the intended direction of reciprocating movement.

In preferred embodiments of the invention, the interacting element is a top element which is mountable to a base or bottom element by simply placing the interacting element onto the base element. The interface between the base and interacting elements would then preferably be sufficient for keeping the two elements in mounted engagement with each other using only the mechanical interface of the invention, aided by gravitational forces. Thereby, mounting becomes very easy and detachment of the elements is easily accomplished by simply lifting one element away from the other. Furthermore, the direction of reciprocal movement is preferably provided essentially along the horizontal plane, such that no forces acting to separate the two elements arise. Thus, a secure and easily detachable mounting configuration is obtained, providing an essentially vibration free transferal of reciprocating movement between the base element and the interacting element.

It should be noted that, in some embodiments, an auxiliary arrangement may be provided for even further securing the interacting element to the base element. Such a configuration may be applied both to the vertical mounting arrangement described in the preceding paragraph, where the reciprocal movement is in the horizontal plane, and to any other orientation of the base and interacting elements. Then, an auxiliary arrangement may be provided for applying additional force pressing the interacting element towards the base element, or vice versa. This is applicable where gravitational forces provide insufficient aid in keeping the elements in mounted relationship, either due to the orientation of the elements or the relationship between the mass and mass distribution of the interacting element and the accelerational forces from the reciprocal movement. Use can then be made of any arrangement which is suitable for providing the requisite forces in view of the intended technical application or environment, including screw fastening, bayonet fitting, conventional clamp lock using a lever, spring-biased lever action, etc. However, it should be noted that the motion transferring interface point or points provide the requisite securing of the interacting element to the base element in the longitudinal movement direction.

In further embodiments of the invention, a guide pin may be provided in the base element for interaction with a corresponding recess in the interacting element, or vice versa. This is intended for facilitating mounting or placement of the interacting element to the base element. The purpose of such a guide pin is mainly to aid in the lateral positioning of the interacting element. In operation of the motion process, the direction of movement is along the longitudinal direction, which means that the interacting element is normally not subjected to lateral forces and the requirements for the dimensional tolerances between the guide pin and the corresponding recess may be low.

However, in particular embodiments of the invention employing a single interface point for transferring the reciprocating movement, a guide pin may be used as said motion transferring interface point. Then, the guide pin is provided with said curved contact surface, at least in the direction of reciprocating movement. Preferably, curved contact surfaces are provided in a forward and rearward surface thereof. Furthermore, the guide pin may be rotational symmetrical such that a curved contact surface is provided all around the periphery of at least an axial portion of the guide pin. However, other configurations are also contemplated, such as an elliptical configuration in a horizontal cross-section of the guide pin.

In the embodiments employing the guide pin for transferring the reciprocal movement, the mating element in the interacting element is preferably a recess having a horizontal cross-section corresponding to the guide pin. Preferably, the recess has a shape of a cone or a frustum cone with a cone angle in the range of 5° to 40°, more preferably between 10° and 30°, and even more preferably between 15° and 25°.

The interface point(s) not being responsible for transferring the reciprocal movement are passive in terms of the reciprocal movement, and preferably only provides a supporting engagement between the base and interacting elements. The supporting engagement could, for example, be in the form of a sliding engagement, as will be described further below, a rolling engagement, where one or more wheels or rollers extending in the lateral direction are provided in the base element or the interacting element, or a linear guide engagement. Furthermore, as stated above, embodiments having no passive interface points are also contemplated within the scope of the invention.

When only one motion transferring interface point is provided, at least two passive interface points are preferably provided, laterally spaced apart on both sides of the lateral centre of gravity of the interacting element. It should be noted that two laterally spaced passive interface points are intended to include a single passive interface member on either of the base and interacting elements, said single member being laterally extended such that it extends to both sides of the lateral centre of gravity of the interacting element. Thereby, at least two spaced apart interface points may be obtained from a single passive interface member.

Furthermore, in exemplifying embodiments, one or more of the curved and opposing contact surfaces may be provided with dampening material, in order to even further reduce remaining vibrations, if any. Such dampening material may be in the form of rubber or a plastic elastomer.

In embodiments of the invention, the base element is in the form of a vibratory feed magazine arranged for providing a reciprocating feeding action for feeding electrical component towards a picking position in a component mounting machine. The reciprocating movement is often so fast and the length of stroke so short that it to a human observer may appear as a mere vibration, rather than an accurately controlled reciprocating movement, hence the term "vibratory" feed. This must not be confused with the undesired vibrations that may arise in prior art solutions due to play or other misalignments between base and interacting elements.

Furthermore, the interacting element is in exemplifying embodiments a component tube holder for holding a plurality of component tubes containing consecutively stored components for picking and placing in a component mounting machine. Preferably, the interacting element comprises a support surface for supporting the component tubes, a reception portion for receiving an open end of the component tubes, and at least one component stop at the reception portion defining a picking position for components fed from said open end of the component tubes.

As understood by the man skilled in the art, the mechanical interface in accordance with the present invention provides for a quicker and easier mounting of releasably mountable elements, while still providing an essentially vibration free interface for transferring a reciprocal movement between the two elements.

BRIEF DESCRIPTION OF THE DRAWINGS

Further details and aspects of the invention will become apparent from the following detailed description of embodiments of the invention, reference being made to the accompanying drawings, wherein like reference numerals refer to similar parts throughout, in which:

FIGS. 6 and 7 are perspective and schematical top plan views of an interacting element and a base element, respectively, according to further embodiments of the invention.

DETAILED DESCRIPTION OF EXEMPLIFYING EMBODIMENTS

Figure 1:
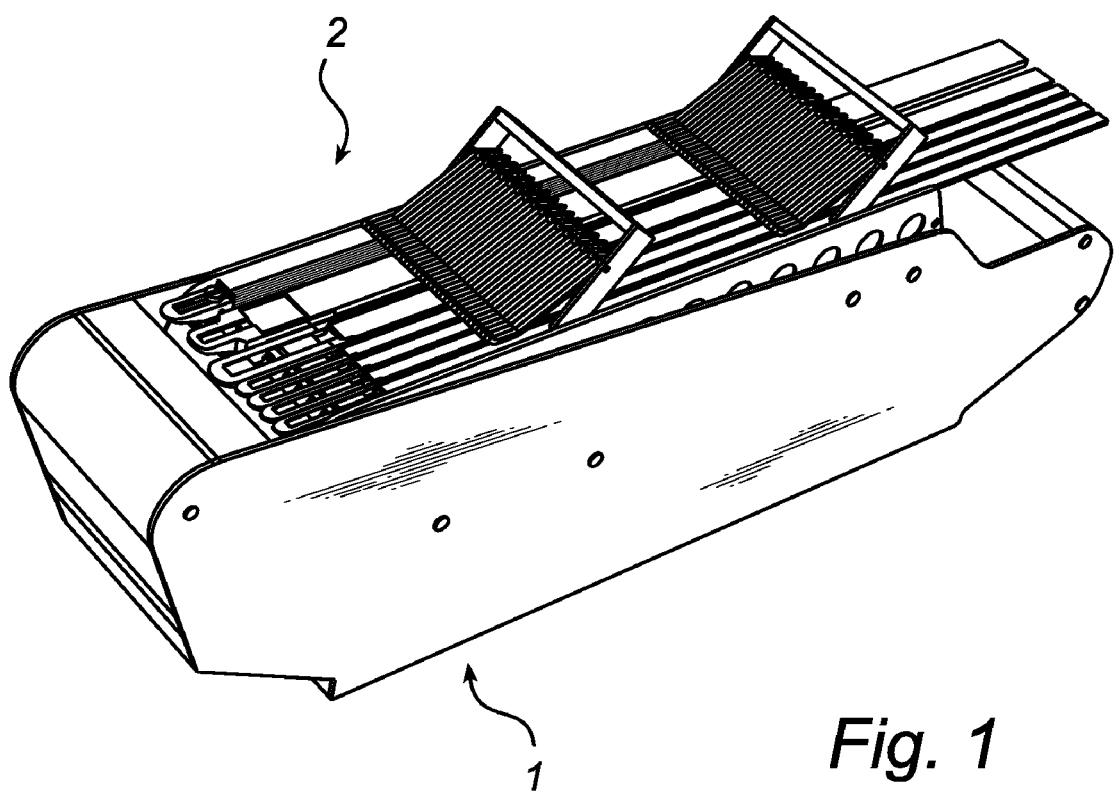
FIG. 1 is a perspective view of an embodiment of a base element and an interacting element.
Figure 2:
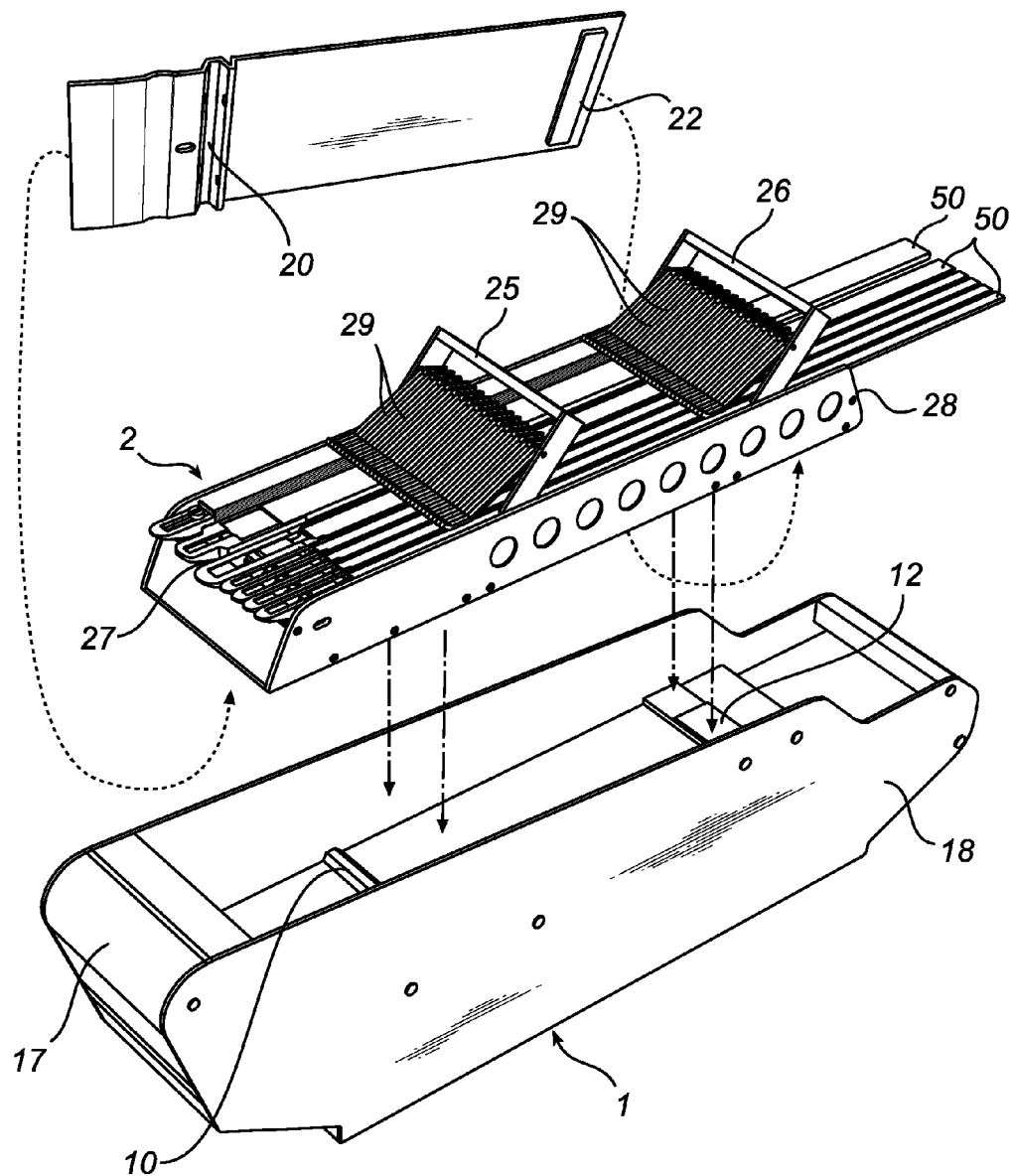
FIG. 2 is a further perspective view of the embodiment shown in FIG. 1 illustrating the releasability of the interacting element in relation to the base element.

The following is a description of exemplifying embodiments in accordance with the present invention. This description is intended for describing the general principles and specific embodiments of the invention and is not to be taken in a limiting sense. Thus, even though specific examples of a vibratory or reciprocatory feed magazine for a mounting process in component mounting machine will be shown, the invention is also applicable to other industrial applications where a reciprocal movement is to be transferred from a first element to a second element releasably mountable to the first element.

In the following, for illustrative purposes, the base element is embodied as a vibratory or reciprocatory feed magazine, and the interacting element is embodied as a component tube holding arrangement, also referred to as a pallet. Furthermore, in the illustrated embodiments, the base element is embodied as a lower element onto which the interacting element is releasably mounted as an upper element. An advantage of such a solution is that the gravitational forces may be sufficient for keeping the two elements in mounted engagement, due to the advantageous configuration of the disclosed mechanical interface, and that detachment of the elements is easily accomplished by simply lifting one element away from the other. However, as mentioned above, the mechanical interface according to the invention may also be applied for engaging elements which are not mounted on top of each other. With reference first to FIGS. 1-5, there is shown an embodiment of a vibratory feed component magazine 1 and a component tube holding arrangement 2, arranged for holding a plurality of component tubes 50 containing components, preferably electrical, arranged in sequence in the component tubes 50. In the embodiments to be described below, the holding arrangement has the general shape of a pallet, onto which component tubes 50 are positioned and held. Therefore, the terms "pallet" and "holding arrangement" may in the following be used interchangeably when referring to the illustrated embodiments. Furthermore, when directions and locations are mentioned, the terms front or forward and rear or rearward are related to the feeding direction of the components. Thus, the magazine 1 has a forward end 17 and a rearward end 18, and the holding arrangement or pallet 2 has a forward end 27 and a rearward end 28. Thus, components are fed within the component tubes from the right to left in FIGS. 1-4 and exit the tubes for picking at a picking position or location located at the forward end of the pallet 2.

The holding arrangement 2 is releasably mountable to the magazine 1 via a mechanical interface comprising, in this embodiment, a first or forward interface portion 10, 20 and a second or rearward interface portion 12, 22. The forward interface portion includes a lower interface element 10 provided in the magazine 1, and an upper interface element 20 provided in the holding arrangement 2. Similarly, the rear interface portion includes a lower interface element 12 provided in the magazine 1, and an upper interface element 22 provided in the holding arrangement 2. For providing easy handling of the pallet 2 and mounting thereof to the magazine 1, the pallet 2 is provided with forward and rearward handles 25, 26. In addition to providing easy handling or lifting of the pallet, the handles are also used for mounting of biased depression elements 29 for securing the component tubes 50 to the pallet 2, in the form of a plurality of spring biased holding fingers 29 applying a downward pressure onto the tubes 50 inserted under the holding fingers 29.

Furthermore, the vibratory feed magazine 1 comprises vibratory or reciprocatory feeding means or movement generator 15, arranged for generating a reciprocating movement and for transferring this movement via an intermediate element 16 to the forward interface element 10. The reciprocating movement is often so fast and the length of stroke so short that it to a human observer may appear as a mere vibration, rather than an accurately controlled reciprocating movement, hence the term "vibratory" feed. This must not be confused with the undesired vibrations that may arise in prior art solutions due to play or other misalignments between base and interacting elements. As movement generating device 15, use may be made of movement generators generally known within the art, such as solenoids or linear motors. Therefore, the movement generator 15 will not be described in further detail.

Figure 4:
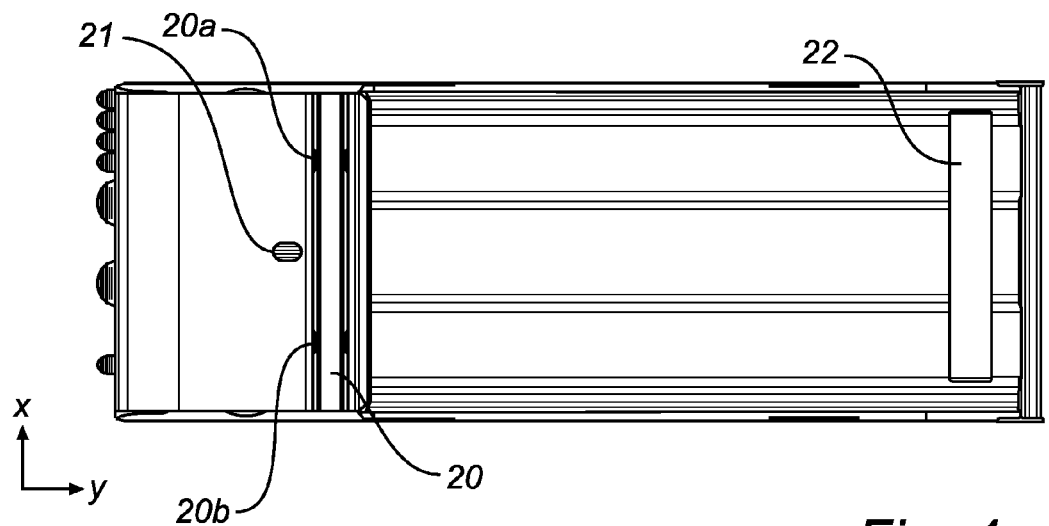
FIG. 4 is a bottom plan view of the interacting element of the FIG. 1 embodiment.
Figure 5:
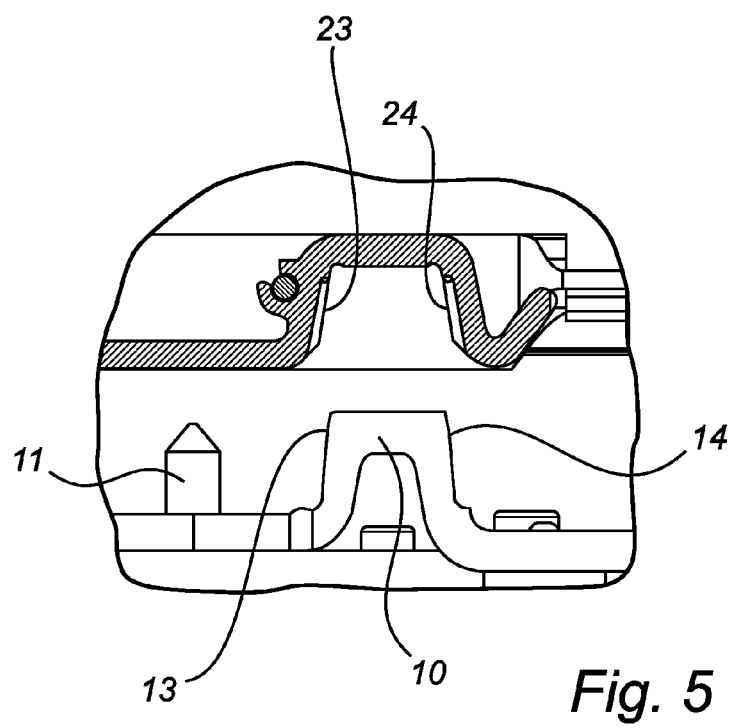
FIG. 5 is an enlarged partial sectional view illustrating the interface between the base element and the interacting element.

Turning specifically to FIGS. 4 and 5, the mechanical interface, according to embodiments of the present invention, between the base element or magazine 1 and the interacting element or pallet 2 will be described. In this embodiment, the reciprocating movement is transferred from the magazine 1 to the pallet 2 via the forward interface portion 10, 20, while the rear interface portion 12, 22 merely provides a sliding engagement and secures proper alignment and orientation of the magazine 1 and pallet 2 in a vertical or Z direction. Even though all illustrated embodiments utilize a forward engagement portion for transferring motion, describing preferred embodiments, it should be noted that the present invention is by no means limited to such a configuration. Alternatively, the movement transferring portion of the interface may be provided solely at the rear end of the pallet/magazine, or at both the rear and forward ends.

The forward interface portion comprises two laterally separated interface points, of which the interface points 20a, 20b of the pallet can be seen in FIG. 4. In the magazine 2, the interface element is in the form of a laterally extending bar 10, with a general cross-sectional shape of a frustum cone, but provided with cross-sectional curvatures at the upper portion thereof. These curvatures result in curved upper contact surface portions 13 and 14, which are aligned in the longitudinal direction of the magazine 1, i.e. in the movement or feeding direction of the magazine and pallet which is indicated in the figures as the Y direction. In the pallet, the interface element 20 comprises a laterally extending recess 20, with laterally separated, slightly protruding interface points 20a, 20b. In this embodiment, each interface point 20a, 20b have the cross-sectional shape of a frustum cone, with contact surface portions 23, 24 thereof being conical.

It should be noted that even though in the illustrated example, the two upper contact surface portions 13 and 14 of the base element are both curved, embodiments of the invention are not limited to the illustrated example. In some embodiments, one of said two upper contact surface portions 13, 14 may be curved in cross-section, while the other contact surface is essentially straight in cross section. It should also be noted that even though, in this embodiment, curved contact surfaces 13, 14 are located in the base element and essentially straight contact portions 23, 24 are located in the interacting element, this configuration could be reversed. Furthermore, it is also contemplated that mating contact surface portions of both the base and interacting element, in at least one interface point, are presented with a curvature at the abutment between the two.

Upon mounting of the pallet 2 onto the magazine 1, the contact surface portions 23, 24 of the pallet are brought into contact with the corresponding curved contact surface portions 13, 14 of the magazine. Due to the curvature of the base element contact surfaces 13, 14, a contact without gaps and with freedom from play is obtained. Furthermore, the curvature renders the interface tolerant to wear of the contact surfaces, and the conical configuration of the upper contact surfaces 23, 24 results in an easy mounting of the pallet 2 to the magazine 1. Preferably, the cone angle is in the range of 5° to 40°, more preferably between 10° and 30°, and even more preferably between 15° and 25°.

In this embodiment, the cone angle is about 20°. Thereby, the abutment between the curved contact surface 13, 14 of the magazine 2 and the corresponding opposing contact surface 23, 24 of the pallet is in a tangential plane at an angle of about 80° to the horizontal plane, which in the described embodiment corresponds to the lateral plane of the feeding movement. Thereby, the reciprocating feeding movement may be transferred almost normal to the plane of the abutment, which will minimize disturbing forces generated by the movement. Furthermore, the cone angle will be sufficiently small to allow the pallet to rest on the magazine in a stable and secure manner, due to the gravitational force and weight of the pallet, while still being sufficiently large to avoid a wedging effect that will impede with the easy removal of the pallet from the magazine. Also, by providing the abutment point in a horizontal plane essentially corresponding to or being in vertical proximity of the horizontal plane of the centre of gravity, essentially no forces will arise to rotate or move the pallet in other directions than the intended reciprocating feeding direction.

Furthermore, the curved contact surface will render the interface independent of the angular orientation of the pallet 2 relative the magazine 1. In other words, even if a disturbance or tolerance fault of the rear interface portion 12, 22 would result in an elevated position of the pallet rear end 28, i.e. a forward tilt of the pallet 2, the curvature of the surface portions 13, 14 would still ensure a proper and secure interface between the pallet 2 and the magazine 1.

In the embodiment shown in the drawings, the engaging portions of the motion transferring interface points 10 and 20 are formed by anodized aluminum. However, other rigid and wear-resistant materials are also contemplated, for instance any other suitable metal, such as steel, or a suitable plastics material, such as polyetheretherketones (PEEK).

In the illustrated embodiment, the magazine 1 comprises a guide pin 11 for interaction with an engaging guide pin hole 21 of the pallet. Here, the guide pin interface 11, 21 is used for the lateral positioning of the pallet 2 relative the magazine 1, i.e. in the X direction as illustrated in the drawing. As understood by the skilled person, means may be provided in the forward interface portion, in the rear interface portion, or in both, for providing said lateral positioning. Thus, the guide pin 11 and co-operating guide pin hole 21 are optional. Furthermore, such a guide pin could in theory also be used for positioning the pallet in the longitudinal or Y direction. Then, the positioning or guiding by the pin in the longitudinal direction could be limited to guiding during assembly or mounting of the base and interacting elements only. In operation of the movement process, the guide pin is only acting for positioning in the lateral direction. However, in the illustrated embodiment, a proper longitudinal positioning of the pallet is obtained by the forward interface portion 10, 20.

Figure 3:
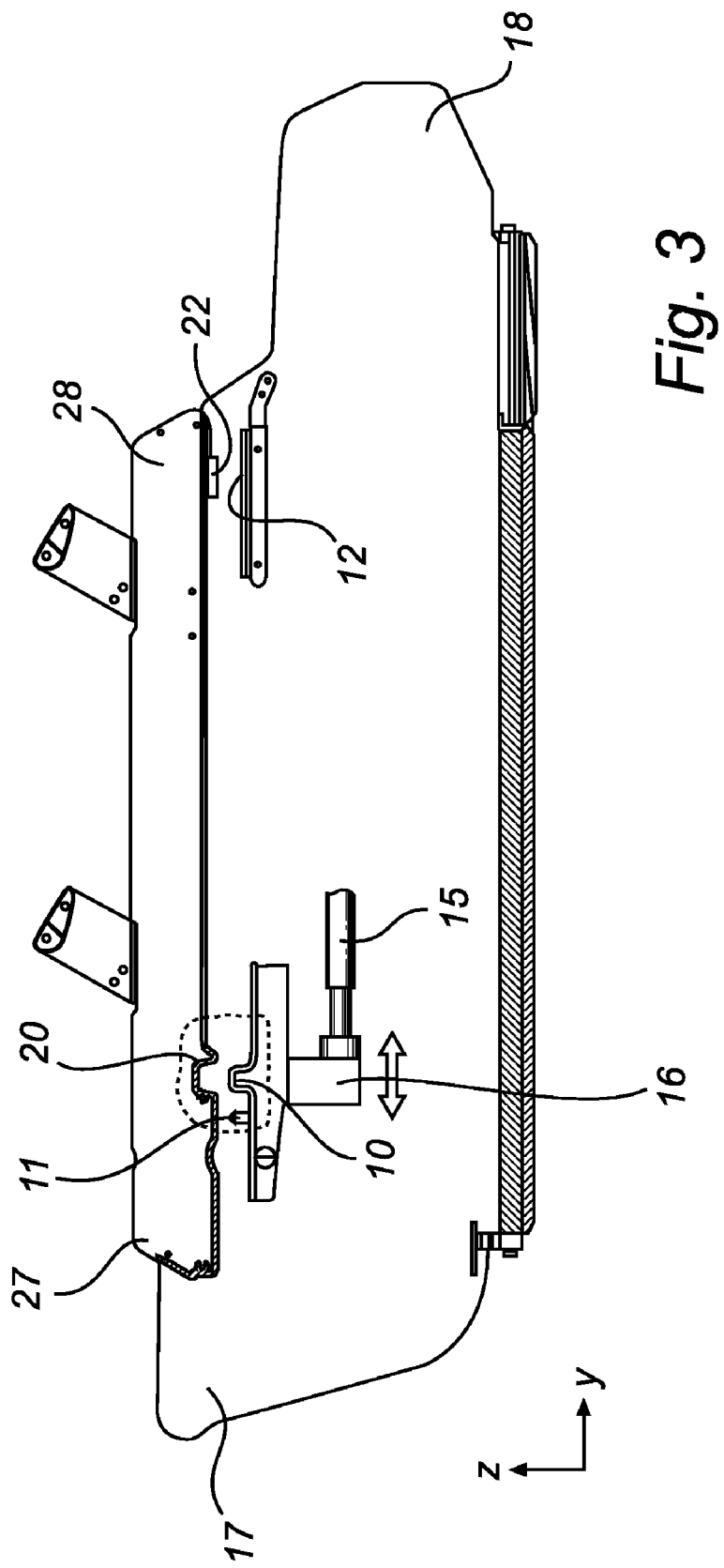
FIG. 3 is a sectional view of the FIG. 1 embodiment.

Furthermore, rear interface portion 12, 22 provides a sliding engagement between a sliding plate 12 of the magazine 1 and a corresponding sliding plate 22 of the pallet 2. In this embodiment, the magazine plate 12 is located at the lateral centre of the magazine and pallet, while the pallet plate 22 extends laterally to essentially the width of the pallet 2. Of course, this may also be reversed, resulting in a narrow, laterally centrally located pallet plate 22, and a laterally extended magazine plate 12. Preferably, at least one of the sliding plates 12, 22 are formed from a durable, low friction plastic material. Thus, vertical positioning of the pallet 2, i.e. in the Z-direction as indicated in FIG. 3, is obtained by the rear, laterally central interface portion 12, 22 and the front, laterally separated interface portions 10, 20.

In the described embodiment of the rear interface portion, the sliding plate 12 of the magazine 1 is formed by stainless steel and the sliding surface 22 of the pallet 2 is formed by polyoxymethylene (POM). The materials have been selected to provide low friction for silent operation, as well as low wear. As understood by the skilled person, a sliding engagement arranged to fulfill these requirements may be formed by a vast number of suitable materials. Thus, the invention is by no means limited to particular materials, and any suitable materials are contemplated within the scope of the present invention.

Turning now to FIGS. 6 and 7, a further embodiment of an interacting element or pallet 202 is illustrated in a perspective view and of a base element or magazine 201 in a highly schematical top plan view. Here, the interacting element 202 has a slender configuration and is arranged for holding a smaller number of component positioners 60 and component tubes 50. The general function and features of the interacting element 202 are the same as described above, e.g. in relation to FIGS. 1-5. However, the interface elements are in this embodiment of a different configuration. First, the lower forward interface portion 220 is in the form of a guide pin having a curved contact surface area at least in the direction of reciprocating movement, i.e. in a forward and/or rearward surface thereof. Preferably, the guide pin is rotational symmetrical, but other configurations may also be appropriate, such as an elliptical configuration in a horizontal cross-section.

The upper part of the forward interface portion, i.e. in the interacting element 202, is preferably a recess having horizontal cross-section corresponding to the guide pin 220. Thus, the recess has preferably a conical shape with a cone angle in the range of 5° to 40°, more preferably between 10° and 30°, and even more preferably between 15° and 25°. In this embodiment, two rear interface portions 222a, 222b are laterally spaced apart and provide a sliding engagement with corresponding interface portions provided in the interacting element 202, preferably a sliding plate.

Furthermore, the rear interface portions may also be provided with a lateral guiding element restricting the lateral movement of the rear end of the interacting element 202.

Thereby, any rotating effect on the interacting element due to an offset centre of gravity or an offset reciprocal movement will be efficiently reduce or eliminated. As understood by the skilled person, the more slender configuration of the interacting element 202 may be used for providing a more slender base element, or, more appropriately, for providing a base element arranged to hold a plurality of interacting elements 202. Then, the interface portions schematically illustrated in FIG. 7 are suitably multiplied.

The invention has been described above with reference to a few embodiments. However, as is readily appreciated by a person skilled in the art, other embodiments than the ones disclosed above are also contemplated within the scope of the present invention. For instance, the interface elements having curved contact surfaces and described to be positioned in the lower interface elements may interchangeably be provided in the upper interface portions, i.e. in the pallet or holding arrangements. Also, the front and rear positioning of the described configurations of the front and rear interface elements are generally interchangeable.

The invention claimed is:

1. A mechanical interface for transferring a reciprocating movement from a base element to an interacting element, wherein the interacting element is releasably mountable to the base element, comprising:
   at least a first, second and third interface point between the base element and the interacting element, wherein each interface point comprises a base contact portion and an interacting contact portion,
   wherein said base element comprises or is connectable to a motion generator configured to provide said reciprocating movement essentially in a first, longitudinal direction,
   wherein at least two of said first, second and third interface points are longitudinally spaced apart, and at least two of said first, second and third interface points are laterally spaced apart in a second, lateral direction essentially perpendicular to said first direction,
   wherein at least one of said first, second and third interface points is arranged to transfer said reciprocating movement from the base element to the interacting element, and at least one of said first, second, and third interface points provides a supporting engagement between said base and said interacting element, but is passive with regard to transferring reciprocal movement,
   wherein at least one of the base contact portion and the interacting contact portion of the at least one interface point arranged to transfer said reciprocating movement includes at least two oppositely facing curved contact surface portions, arranged in longitudinal alignment with said first direction, such that said curved contact surface portions are in abutment with opposing contact surface portions of the interface point when the interacting element is mounted to the base element, thereby transferring said reciprocating movement from the base element to the interacting element, and
   wherein the at least one interface point providing a supporting engagement is configured to allow for longitudinal motion between the contact surfaces of the base element and the interacting element.

2. The interface as claimed in claim 1, wherein said at least one interface point arranged to transfer said reciprocating movement is a single interface point arranged in alignment with the lateral center of the interacting element.

3. The interface as claimed in claim 1, wherein said at least one interface point arranged to transfer said reciprocating movement includes at least two interface points.

4. The interface as claimed in claim 3, wherein said at least two interface points are laterally spaced and arranged in lateral alignment with each other.

5. The interface as claimed in claim 3, wherein said at least two interface points are laterally spaced, and arranged on either side of the lateral center of the interacting element.

6. The interface as claimed in claim 3, wherein the base contact portions of said at least two interface points are arranged on a single motion transferring element operatively connected to said movement generator.

7. The interface as claimed in claim 1, wherein at the abutment between said curved contact surface portion and said opposing contact surface portion, a tangent plane is formed, said curved and opposing contact surface portions being adapted such that said tangent plane is formed at an angle less than 90° to said first direction.

8. The interface as claimed in claim 7, wherein said angle is between 88° and 70°.

9. The interface as claimed in claim 7, wherein the angle between said first direction and said tangent plane is provided by forming said opposing contact surface portion at said angle to said first direction, at least at the abutment with said curved surface.

10. The interface as claimed in claim 7, wherein a curvature of the at least two oppositely facing curved contact surface portions and of the opposing contact surface portions of the at least one interface point arranged to transfer said reciprocating movement are different.

11. The interface as claimed in claim 10, wherein the at least two oppositely facing curved contact surface portions and the opposing contact surface portions of the at least one interface point arranged to transfer said reciprocating movement form a point contact in the longitudinal direction therebetween.

12. The interface as claimed in claim 1, wherein at least one of said curved and opposing contact surface portions is provided with dampening material.

13. The interface as claimed in claim 1, wherein said base element is a bottom element and said interacting element is a top element.

14. The interface as claimed in claim 1, further comprising a guiding pin and a corresponding guiding recess provided in the base element and interacting element, respectively, or vice versa, for facilitating the mounting of said interacting element to said base element.

15. The interface as claimed in claim 14, wherein said guide pin and guiding recess constitute one said at least one interface point arranged to transfer said reciprocating movement.

16. The interface as claimed in claim 1, wherein the at least one interface point providing a supporting engagement is arranged for sliding engagement.

17. The interface as claimed in claim 16, wherein said at least one passive interface point includes at least two passive interface points, laterally spaced on either side of the lateral center of the interacting element.

18. The interface as claimed in claim 1, wherein said base element is a vibratory feed magazine comprising said motion generator, for reciprocating feeding of components held by the interacting element towards a picking position in a component mounting machine.

19. The interface as claimed in claim 18, wherein said interacting element is a component tube holder for holding a plurality of component tubes containing consecutively stored components, and for reciprocating feeding of said components towards the picking position in the component mounting machine.

20. The interface as claimed in claim 19, wherein said interacting element comprises a support surface for supporting the component tubes, a reception portion for receiving an open end of the component tubes, and at least one component stop at the reception portion defining a picking position for components fed from said open end of the component tubes.

21. A mechanical interface for transferring a reciprocating movement from a base element to an interacting element, wherein the interacting element is releasably mountable to the base element, comprising:
- at least a first, second and third interface point between the base element and the interacting element, wherein each interface point comprises a base contact portion and an interacting contact portion,
- wherein said base element comprises or is connectable to a motion generator configured to provide said reciprocating movement essentially in a first, longitudinal direction,
- wherein at least two of said first, second and third interface points are longitudinally spaced apart, and at least two of said first, second and third interface points are laterally spaced apart in a second, lateral direction essentially perpendicular to said first direction,
- wherein at least one of said first, second and third interface points is arranged to transfer said reciprocating movement from the base element to the interacting element,
- wherein at least one of the base contact portion and the interacting contact portion of the at least one interface point arranged to transfer said reciprocating movement includes at least two oppositely facing curved contact surface portions, arranged in longitudinal alignment with said first direction, such that said curved contact surface portions are in abutment with opposing contact surface portions of the interface point when the interacting element is mounted to the base element, thereby transferring said reciprocating movement from the base element to the interacting element, and
- wherein a curvature of the at least two oppositely facing curved contact surface portions and of the opposing contact surface portions of the at least one interface point arranged to transfer said reciprocating movement are different.

22. The interface as claimed in claim 21, wherein the at least two oppositely facing curved contact surface portions and the opposing contact surface portions of the at least one interface point arranged to transfer said reciprocating movement form a point contact in the longitudinal direction therebetween.

* * * * *